United States Patent
Sim et al.

(10) Patent No.: US 9,041,088 B2
(45) Date of Patent: May 26, 2015

(54) NON-VOLATILE MEMORY DEVICES HAVING AIR GAPS AND METHODS OF MANUFACTURING THE SAME

(71) Applicants: Jae-Hwang Sim, Hwaseong-si (KR); Jinhyun Shin, Suwon-si (KR); HoJun Seong, Hwaseong-si (KR)

(72) Inventors: Jae-Hwang Sim, Hwaseong-si (KR); Jinhyun Shin, Suwon-si (KR); HoJun Seong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/339,762

(22) Filed: Jul. 24, 2014

(65) Prior Publication Data

US 2014/0332894 A1    Nov. 13, 2014

Related U.S. Application Data

(63) Continuation of application No. 13/915,158, filed on Jun. 11, 2013.

(30) Foreign Application Priority Data

Jul. 18, 2012 (KR) .................. 10-2012-0078372

(51) Int. Cl.
| | |
|---|---|
| H01L 29/06 | (2006.01) |
| H01L 21/764 | (2006.01) |
| H01L 29/788 | (2006.01) |
| H01L 27/115 | (2006.01) |
| H01L 21/762 | (2006.01) |

(52) U.S. Cl.
CPC ........ *H01L 29/0653* (2013.01); *H01L 29/0649* (2013.01); *H01L 21/764* (2013.01); *H01L 29/7881* (2013.01); *H01L 27/11524* (2013.01); *H01L 27/11517* (2013.01); *H01L 27/11563* (2013.01); *H01L 21/76289* (2013.01)

(58) Field of Classification Search
CPC ............... H01L 27/11521; H01L 21/28273; H01L 27/115; H01L 29/7881; H01L 29/792
USPC .............. 257/314, 326, E29.3, 316, 321
See application file for complete search history.

(56) References Cited

U.S. PATENT DOCUMENTS

| | | | |
|---|---|---|---|
| 7,078,352 B2 | 7/2006 | Beyer et al. | |
| 7,396,732 B2 | 7/2008 | Kunnen | |
| 7,400,024 B2 | 7/2008 | Kunnen | |
| 7,682,904 B2 | 3/2010 | Kim et al. | |

(Continued)

FOREIGN PATENT DOCUMENTS

| | | |
|---|---|---|
| JP | 07-022310 | 1/1995 |
| JP | 2005-123607 | 5/2005 |

(Continued)

*Primary Examiner* — Chuong A Luu
*Assistant Examiner* — Rodolfo Fortich
(74) *Attorney, Agent, or Firm* — Myers Bigel Sibley & Sajovec, PA

(57) ABSTRACT

Disclosed are non-volatile memory devices and methods of manufacturing the same. The non-volatile memory device includes device isolation patterns defining active portions in a substrate and gate structures disposed on the substrate. The active portions are spaced apart from each other in a first direction and extend in a second direction perpendicular to the first direction. The gate structures are spaced apart from each other in the second direction and extend in the first direction. Each of the device isolation patterns includes a first air gap, and each of a top surface and a bottom surface of the first air gap has a wave-shape in a cross-sectional view taken along the second direction.

21 Claims, 25 Drawing Sheets

(56) References Cited

U.S. PATENT DOCUMENTS

| | | |
|---|---|---|
| 7,704,851 B2 | 4/2010 | Kim |
| 7,915,156 B2 | 3/2011 | Aoyama et al. |
| 8,008,149 B2 | 8/2011 | Kuniya |
| 8,022,464 B2 | 9/2011 | Sato et al. |
| 2009/0093100 A1 | 4/2009 | Xia et al. |
| 2009/0212352 A1 | 8/2009 | Aoyama et al. |
| 2010/0019311 A1 | 1/2010 | Sato et al. |
| 2012/0001264 A1 | 1/2012 | Kim et al. |
| 2012/0126303 A1* | 5/2012 | Arai et al. .................. 257/316 |

FOREIGN PATENT DOCUMENTS

| | | |
|---|---|---|
| JP | 2008-283095 | 11/2008 |
| JP | 2009-206152 | 9/2009 |
| JP | 2010-027922 | 2/2010 |
| KR | 1020040049421 A | 6/2004 |
| KR | 1020040049969 A | 6/2004 |
| KR | 1020100034939 | 1/2010 |
| KR | 1020100019727 A | 2/2010 |
| KR | 1020100122700 A | 11/2010 |
| KR | 1020120057794 A | 6/2012 |

* cited by examiner

NON-VOLATILE MEMORY DEVICES HAVING AIR GAPS AND METHODS OF MANUFACTURING THE SAME

CROSS-REFERENCE TO RELATED APPLICATION

The present application is a continuation application of and claims priority from U.S. patent application Ser. No. 13/915,158, filed on Jun. 11, 2013 and claims priority under 35 U.S.C. §119 to Korean Patent Application No. 10-2012-0078372, filed on Jul. 18, 2012, and the entire content of each of the above applications is incorporated by reference herein.

BACKGROUND

The inventive concepts relate to non-volatile memory devices and, more particularly, to non-volatile memory devices having air gaps and methods of manufacturing the same.

Semiconductor devices are widely used in the electronics industry. Non-volatile memory devices are one type of semiconductor device that may be used to store logical data. A non-volatile memory device may retain the data stored therein even when the power supply to the device is interrupted.

Non-volatile memory devices having excellent characteristics (e.g., high speed operation, high integration density, excellent reliability, etc.) are increasingly in demand. However, patterns in non-volatile memory devices may become very small as the integration level of the device is increased even further. Since widths of the patterns are reduced, it may be difficult to realize non-volatile memory devices having, for example, excellent reliability.

SUMMARY

Embodiments of the inventive concepts may provide non-volatile memory devices that may exhibit reduced parasitic capacitance and/or channel coupling.

Embodiments of the inventive concepts may also provide methods of manufacturing a non-volatile memory device that exhibit reduced parasitic capacitance and/or channel coupling.

In one aspect, a non-volatile memory device may include: device isolation patterns defining active portions in a substrate, the active portions spaced apart from each other in a first direction and extending in a second direction perpendicular to the first direction; and gate structures disposed on the substrate, the gate structures spaced apart from each other in the second direction and extending in the first direction. Each of the device isolation patterns may include a first air gap; and a top surface and a bottom surface of each of the first air gaps may have a wave-shape in a cross-sectional view taken along the second direction.

In some embodiments, each of the device isolation patterns may include a filling layer having one or more upper portions and one or more lower portions, and the first air gap of each device isolation pattern may be between the one or more upper portions and the one or more lower portions of the filling layer. Each of the device isolation patterns may further include a liner that defines a bottom surface and sidewalls of device isolation pattern. The filling layer may be disposed along profiles of the top surface and bottom surface of the first air gap. The non-volatile memory device may further include spacers that are disposed on sidewalls of the gate structures. The spacers may include a material having an etch selectivity with respect to the filling layer. The non-volatile memory device may further include: a gate protecting layer disposed on sidewalls of the gate structures. A difference between an etch rate of the filling layer and an etch rate of the gate protecting layer may be greater than a difference between the etch rate of the filling layer and an etch rate of the spacer.

Each of the gate structures may include a tunnel dielectric pattern, a charge storage pattern, a blocking dielectric pattern, and a control gate electrode. A top surface of the device isolation pattern may be substantially coplanar with top surfaces of the tunnel dielectric patterns. The gate structures may include cell gate structures and a selection gate structure. A width of the selection gate structure may be greater than a width of each of the cell gate structures. The first air gaps may not extend in the second direction under the full width of the selection gate structure. The non-volatile memory device may also include an interlayer dielectric layer disposed on the gate structures and a plurality of second air gaps that are provided between adjacent ones of the gate structures under the interlayer dielectric layer. Each first air gap may be connected to a respective one of the second air gaps.

In another aspect, non-volatile memory devices are provided that include a plurality of device isolation patterns on a substrate that are spaced apart from each other in a first direction and which extend in a second direction that is different from the first direction, and a plurality of spaced apart gate structures that cross over the device isolation patterns. The device isolation patterns include respective first air gaps that extend continuously under a plurality of adjacent gate structures.

In some embodiments, the device further includes a plurality of active portions in the substrate that are spaced apart from each other in the first direction and which each extend in the second direction. In such embodiments, the gate structures may be spaced apart from each other in the second direction and each gate structure may extend in the first direction. The first direction may be is perpendicular to the second direction.

A height of each first air gap in a third direction that is perpendicular to both the first and second directions may vary, and a portion of each first air gap that has a minimum height may be located under one of the gate structures. Each device isolation layer may include a filling layer that has upper filling layer portions that are above the first air gap and under the respective gate structures and at least one lower filling layer portion that is below the first air gap. A top surface and a bottom surface of each of the first air gaps may have a wave-shape in a cross-sectional view taken along the second direction.

The non-volatile memory device may also include at least one dielectric layer that is disposed on sidewalls of the respective gate structures. The at least one dielectric layer may include a material having an etch selectivity with respect to the filling layer. The gate structures may include cell gate structures and a selection gate structure. A width of the selection gate structure may be greater than a width of each of the cell gate structures. Moreover, the first air gaps may not extend in the second direction under the full width of the selection gate structure. The first air gaps may extend continuously under all of the cell gate structures. Additionally, the non-volatile memory device may further include an interlayer dielectric layer disposed on the gate structures and a plurality of second air gaps that are provided between adjacent ones of the gate structures under the interlayer dielectric layer. AT least some of the first air gaps may be connected to respective ones of the second air gaps.

In another aspect, a method of manufacturing a non-volatile memory device may include: forming device isolation patterns defining active portions in a substrate, the active portions spaced apart from each other in a first direction and extending in a second direction perpendicular to the first direction; forming gate patterns on the substrate, the gate patterns extending in the first direction and spaced apart from each other in the second direction; forming spacers sidewalls on the gate patterns, respectively; and isotropically etching the device isolation patterns to form first air gaps. A top surface and a bottom surface of each of the first air gaps may have a wave-shape in a cross-sectional view taken along the second direction.

In some embodiments, forming the device isolation patterns may include: etching the substrate to form device isolation trenches; forming a liner on sidewalls and a bottom of each of the device isolation trenches; and forming a filling layer in each of the device isolation trenches. Forming the first air gaps may include: wet-etching the filling layers exposed between the gate patterns. The spacers may include a material having an etch selectivity with respect to the filling layer. The method may further include: forming a gate protecting layer covering the gate patterns and the spacers; and anisotropically etching the gate protecting layer to expose the device isolation patterns. Portions of the filling layer respectively may remain under the gate patterns after the first air gaps are formed.

The gate patterns includes cell gate patterns and a selection gate pattern adjacent to the cell gate patterns; and the filling layers may fill portions of the device isolation patterns under the selection gate pattern, respectively. The method may further include: forming an interlayer dielectric layer covering the gate patterns. A second air gap may be defined between the gate patterns adjacent to each other. The filling layer may be formed of a tonen silazene (TOSZ) oxide layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
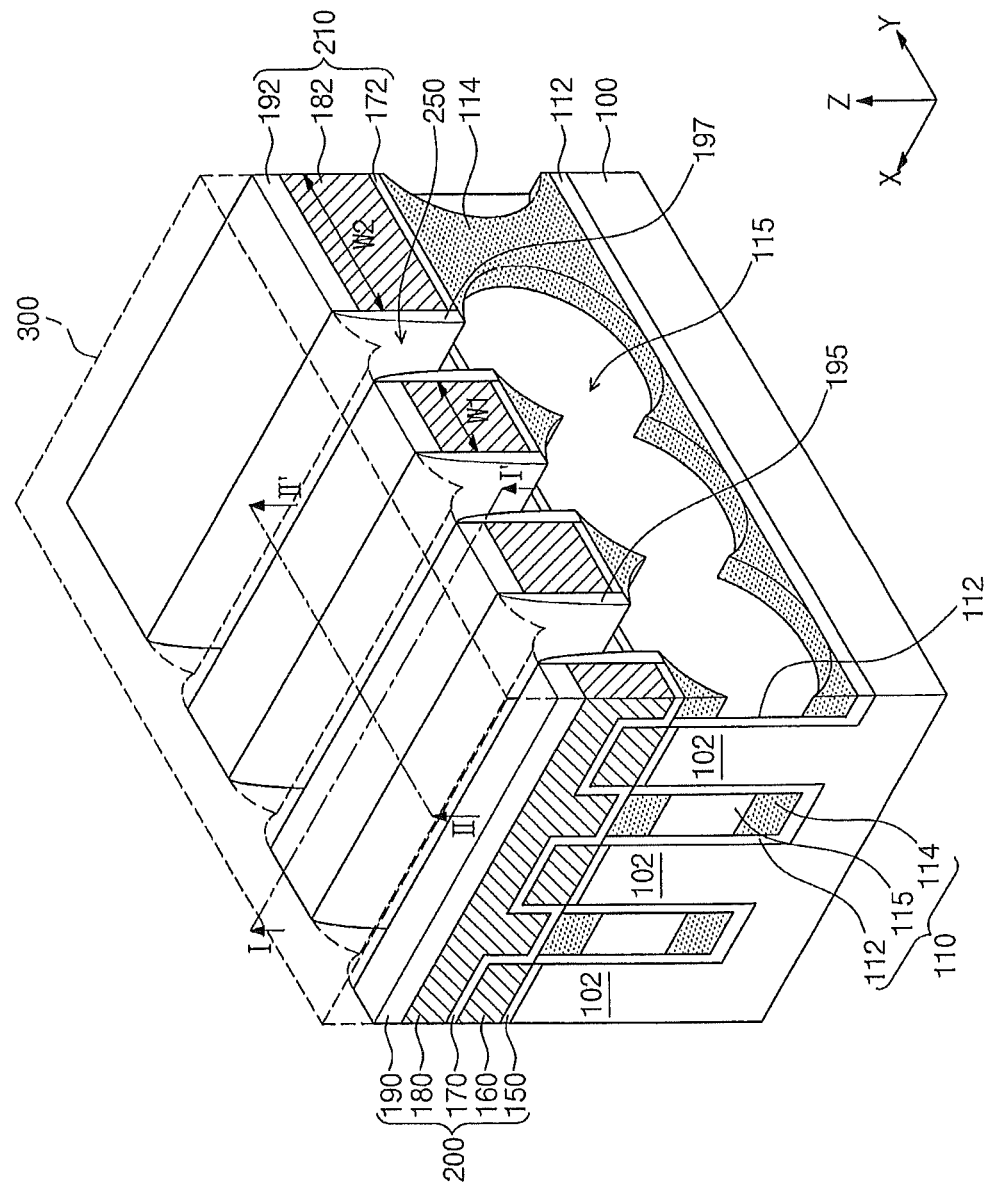
FIG. 1A is a perspective view illustrating a non-volatile memory device according to embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, the relative sizes and/or shapes of various regions may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly on" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
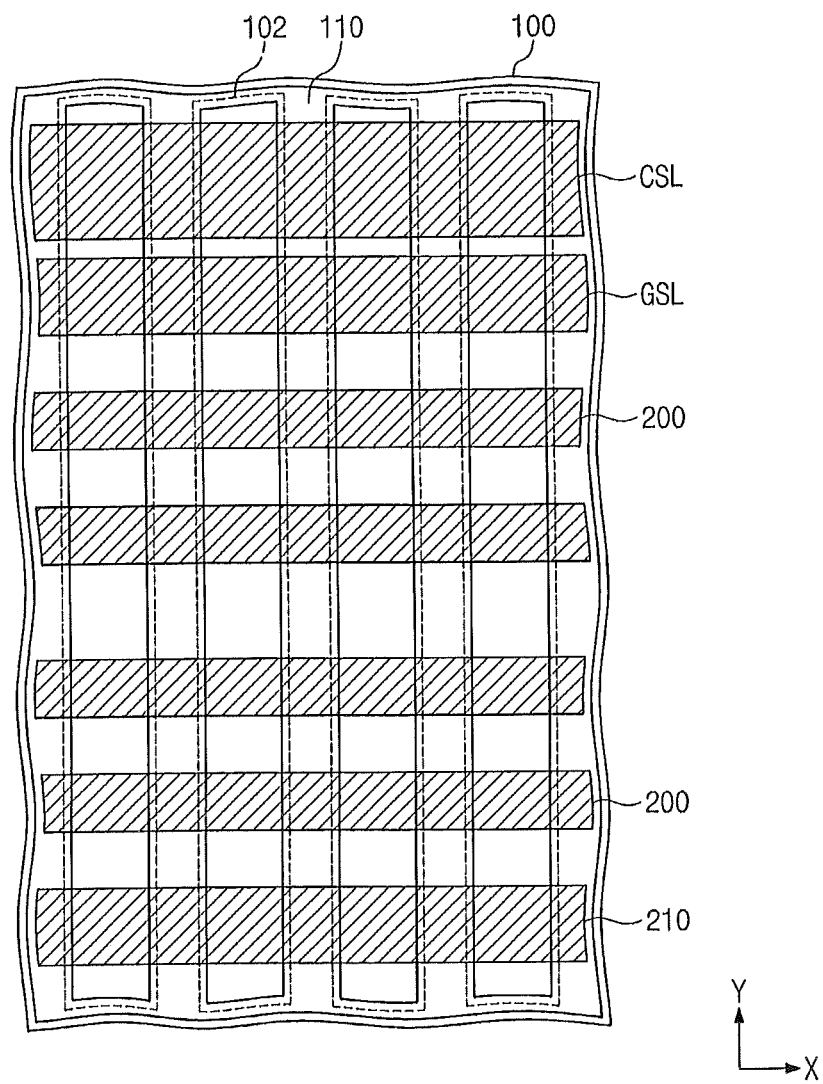
FIG. 1B is a plan view of the non-volatile memory device of FIG. 1A.
Figure 1C:
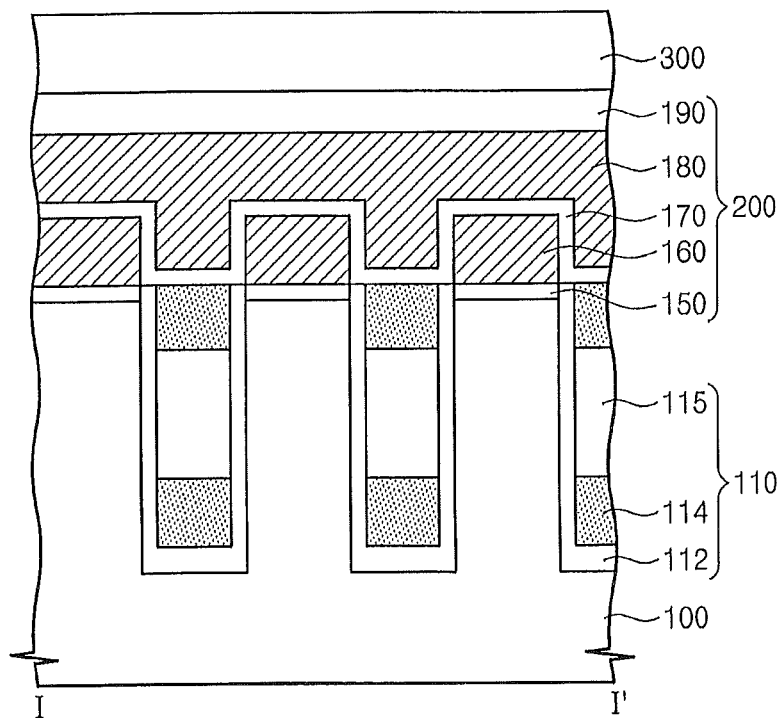
FIG. 1C is a cross-sectional view taken along a line I-I' of FIG. 1A.
Figure 1D:
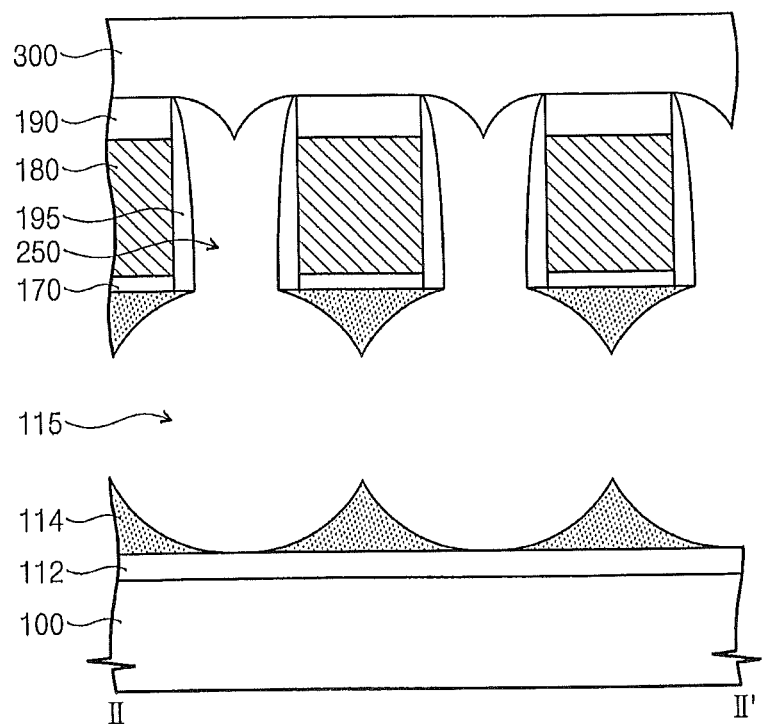
FIG. 1D is a cross-sectional view taken along a line II-II' of FIG. 1A.

FIG. 1A is a perspective view illustrating a non-volatile memory device according to embodiments of the inventive concepts, and FIG. 1B is a plan view of the non-volatile memory device of FIG. 1A. FIG. 1C is a cross-sectional view taken along the line I-I' of FIG. 1A, and FIG. 1D is a cross-sectional view taken along the line II-II' of FIG. 1A.

Referring to FIGS. 1A to 1D, device isolation patterns 110 are disposed in a substrate 100 to define active portions 102.

The substrate 100 may be a semiconductor substrate such as, for example, a silicon substrate, a germanium substrate, or a silicon-germanium substrate. Alternatively, the substrate 100 may be a semiconductor-on-insulator substrate or a semiconductor layer such as an epitaxial-grown semiconductor layer. The device isolation patterns 110 may be spaced apart from each other in a first direction and extend in a second direction perpendicular to the first direction. The first direction may be parallel to an x-axis direction and the second direction may be parallel to a y-axis direction (see FIG. 1A). The active portions 102 may be portions of the substrate 100 that are between the device isolation patterns 110. The active portions 102 may be spaced part from each other by the device isolation patterns 110 and may extend in the second direction. The device isolation patterns 110 and the active portions 102 may be alternatively and repeatedly arranged in the first direction. In some embodiments, the active portions 102 may be doped with dopants of a first conductivity type.

Each of the device isolation patterns 110 may include a liner 112 and a filling layer 114. The liner 112 may form sidewalls and a bottom surface of each of the device isolation patterns 110. The liners 112 of the device isolation patterns 110 may be spaced apart from each other along the first direction. The liners 112 may include oxide. In other embodiments, the liners 112 may be omitted. The filling layer 114 may be formed on the liner 112 in each of the device isolation patterns 110. In some embodiments, a top surface of the filling layer 114 may be substantially coplanar with a top surface of a tunnel dielectric layer 150. However, the inventive concepts are not limited thereto. The top surface of the filling layer 114 may be disposed at one of various levels. The filling layer 114 may include silicon oxide, for example, tonen silazene (TOSZ).

Each of the device isolation patterns 110 may include a first air gap 115 therein. The first air gap 115 may be disposed in the region in which the filling layer 114 is formed. The first air gap 115 may extend through the device isolation pattern 110 in the second direction. In the present embodiments, the first air gap 115 may be formed by removing a portion of the filling layer 114 of the device isolation pattern 110. In a cross-sectional view taken along the second direction (the y-direction in FIG. 1A), a top surface and a bottom surface of the first air gap 115 may be formed in a wave-shape.

A plurality of cell gate patterns 200 may be disposed on the substrate 100. The cell gate patterns 200 may extend in the first direction. The cell gate patterns 200 may be spaced apart from each other in the second direction. The cell gate patterns 200 may form non-volatile memory cells. Each of the cell gate patterns 200 may include the tunnel dielectric layer 150, a charge storage pattern 160, a blocking dielectric pattern 170, and a control gate electrode 180 which are sequentially stacked on the substrate 100.

The tunnel dielectric layer 150 may be disposed on the active portion 102. For example, the tunnel dielectric layer 150 may include an oxide (e.g., silicon oxide) and/or an oxynitride (e.g., silicon oxynitride). The tunnel dielectric layer 150 may be formed by performing an oxidation process and/or a nitridation process on the active portion 102.

The charge storage pattern 160 may be disposed on the tunnel dielectric layer 150. The charge storage pattern 160 may include a semiconductor material. For example, the charge storage pattern 160 may include poly-silicon. In this case, the charge storage pattern 160 may be a floating gate. In other words, charges for storing data may be free charges that are stored within the charge storage pattern 160. The charge storage pattern 160 may be undoped. Alternatively, the charge storage pattern 160 may be doped with dopants. In some embodiments, the charge storage pattern 160 may be doped with dopants of a second conductivity type that is different from the first conductivity type of the dopants that may be doped into the active portion 102 that is under the charge storage pattern 160. One of the first conductivity type dopant and the second conductivity type dopant may be a n-type dopant, the other may be a p-type dopant.

Alternatively, the charge storage pattern 160 may be doped with dopants of the same conductivity type (i.e., the first conductivity type) as the active portion 102. In this case, the charges for storing the data in the charge storage pattern 160 may have an opposite type to major carriers of the charge storage pattern 160. Thus, an energy barrier for the charges stored in the charge storage pattern 160 may increase, so that data retention characteristic of the non-volatile memory cell may be improved.

The blocking dielectric pattern 170 may include an oxide/nitride/oxide (ONO) layer. Alternatively, the blocking dielectric pattern 170 may include a high-k dielectric material having a dielectric constant higher than that of the tunnel dielectric layer 150. For example, the high-k dielectric material may be an insulating metal oxide such as aluminum oxide and/or hafnium oxide. Additionally, the blocking dielectric pattern 170 may include the high-k dielectric material and a barrier dielectric material. The barrier dielectric material may have an energy band gap greater than that of the high-k dielectric material. For example, the barrier dielectric material may include silicon oxide.

The control gate electrode 180 may include a control base gate and a control metal pattern which are sequentially stacked. The control base gate may include a conductive material having an etch selectivity with respect to the control metal pattern. For example, the control base gate may include a doped semiconductor material (e.g., doped silicon and/or doped silicon-germanium). However, the inventive concepts are not limited thereto. In other embodiments, the control base gate may include at least one of other conductive materials having etch selectivity with respect to the control metal pattern. For example, the control base gate may include a conductive metal nitride (e.g., titanium nitride, tantalum nitride, and/or tungsten nitride) and/or a transition metal (e.g., titanium and/or tantalum). Alternatively, the control base gate may include a doped semiconductor material and a conductive metal nitride. The control metal pattern may include a metal having low resistivity. For example, the control metal pattern may include tungsten or copper.

Each of the cell gate patterns 200 may further include a capping pattern 190 that is disposed on the control gate electrode 180. The capping pattern 190 may include, for example, silicon oxide, silicon nitride, and/or silicon oxynitride. Spacers 195 may be disposed on sidewalls of the cell gate patterns 200, respectively. As illustrated in FIG. 1A, at least a portion of a space between an adjacent pair of cell gate patterns 200 may be filled with the spacers 195. The spacers 195 may include, for example, silicon oxide (e.g., a high density plasma (HDP) oxide) or silicon nitride. The spacers 195 may include a material having an etch selectivity with respect to the filling layer 114 of the device isolation pattern 110. Thus, the spacers 195 may protect the cell gate patterns 200 during a process for forming the first air gap 115, so that the cell gate patterns 200 may not be damaged by the process that is used to form the first air gap 115.

A selection gate pattern 210 may be disposed at a side of the cell gate patterns 200. The selection gate pattern 210 may include a selection gate dielectric layer (not visible in FIGS. 1A-D, but generally corresponding to gate dielectric layer 150), a selection bottom gate layer (also not visible in FIGS.

1A-D, but generally corresponding to charge storage pattern 160), a selection interlayer pattern 172, and a selection gate electrode 182 which are sequentially stacked. The selection gate pattern 210 may further include a selection capping pattern 192 that is disposed on the selection gate electrode 182. Selection spacers 197 may be disposed on sidewalls of the selection gate patterns 210, respectively. The selection gate dielectric layer, the selection bottom gate, the selection interlayer pattern 172, and the selection gate electrode 182 of the selection gate pattern 210 may include the same materials as the tunnel dielectric layer 150, the charge storage pattern 160, the blocking dielectric pattern 170, and the control gate electrode 180 of the cell gate pattern 200, respectively.

The selection gate pattern 210 may correspond to a string selection gate pattern. The distances between adjacent cell gate patterns 200 may be substantially equal to a distance between the selection gate pattern 210 and the nearest cell gate pattern 200. A width W2 of the selection gate pattern 210 may be greater than a width W1 of the cell gate patterns 200.

The first air gap 115 of the device isolation pattern 110 may not be formed under the selection gate pattern 210. The filling layer 114 may fill a part of the device isolation pattern 110 under the selection gate pattern 210. In other words, the first air gap 115 may extend in the second direction under the cell gate patterns 200 but may not be formed (or may only partially be formed) under the selection gate pattern 210.

An interlayer dielectric layer 300 may be disposed on the cell gate patterns 200 and the selection gate pattern 210. Second air gaps 250 may be formed between adjacent cell gate patterns 200 and between the selection gate pattern 210 and the cell gate pattern 200 that is adjacent thereto. The second air gaps 250 may be surrounded by the substrate 100, the gate patterns 200 and 210, and the interlayer dielectric layer 300. The second air gaps 250 may extend in the first direction along the cell gate patterns 200 and the selection gate pattern 210. The second air gaps 250 may be spaced apart from each other in the second direction. The first and second air gaps 115 and 250 may be connected to each other. The interlayer dielectric layer 300 may include an oxide (e.g., tetra-ethyl-ortho-silicate (TEOS) oxide).

A ground selection gate pattern GSL and a common source line CSL (not shown in the figures) may be disposed at another side of the cell gate patterns 200. The cell gate patterns 200 may be disposed between the ground selection gate pattern GSL and the selection gate pattern 210.

The non-volatile memory device according to the present embodiment includes the device isolation patterns 110 that have the first air gaps 115. The first air gaps 115 are disposed between the active portions 102 of the substrate 100, so that channel coupling between the active portions 102 may be reduced. Thus, a programming characteristic of the non-volatile memory device may be improved. The top surface and bottom surface of the first air gap 115 may have the wave-shape. Additionally, the second air gap 250 may be disposed between the cell gate patterns 200 and may extend in the first direction. Thus, parasitic capacitance between adjacent cell gate patterns 200 may be reduced to improve the programming characteristic of the non-volatile memory device.

Hereinafter, a method of manufacturing the non-volatile memory device will be described to explain features of the inventive concepts in more detail.

FIGS. 2A to 12A are cross-sectional views taken along a line of FIG. I-I' of FIG. 1A and FIGS. 2B to 12B are cross-sectional views taken along a line of II-II' of FIG. 1A that are used to explain a method of manufacturing a non-volatile memory device according to embodiments of the inventive concepts.

Figure 2A:
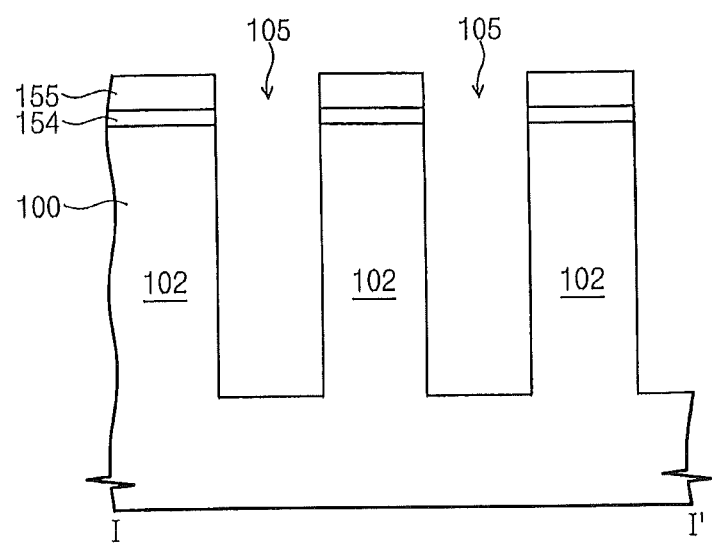
FIGS. 2A to 12A are cross-sectional views taken along a line of FIG. I-I' of FIG. 1A and FIGS. 2B to 12B are cross-sectional views taken along a line of II-II' of FIG. 1A that are used to explain a method of manufacturing the non-volatile memory device illustrated in FIG. 1A.
Figure 2B:
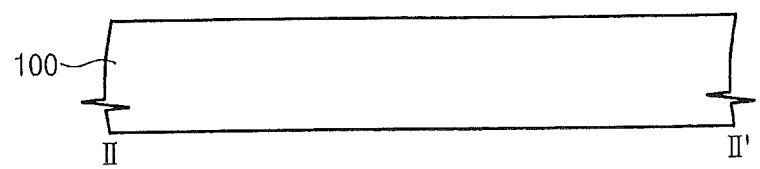

Referring to FIGS. 2A and 2B, device isolation trenches 105 may be formed in the substrate 100. In some embodiments, a buffer dielectric layer 154 and a first mask layer 155 may be sequentially formed on the substrate 100. The buffer dielectric layer 154 may be formed by a thermal oxidation process that is performed on a top surface of the substrate 100. The first mask layer 155 may include openings that define the device isolation trenches 105. The buffer dielectric layer 154 and the substrate 100 may be successively etched using the first mask layer 155 having the openings as an etch mask to form the device isolation trenches 105. Portions of the substrate 100 between the device isolation trenches 105 may be defined as active portions 102. The active portions 102 may be doped with dopants of a first conductivity type.

The substrate 100 may be a semiconductor substrate (e.g., a silicon substrate, a germanium substrate, or a silicon-germanium substrate). The buffer dielectric layer 154 may include an oxide (e.g., silicon oxide). The first mask layer 155 may be a photoresist layer or a hard mask layer.

Figure 3A:
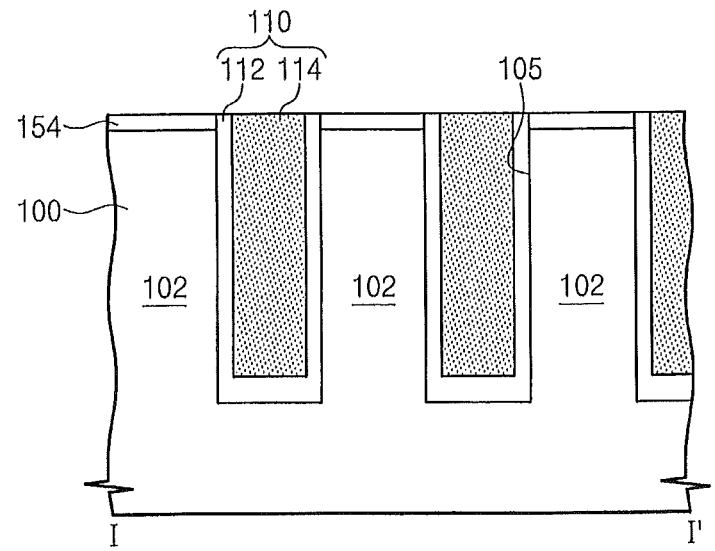
Figure 3B:
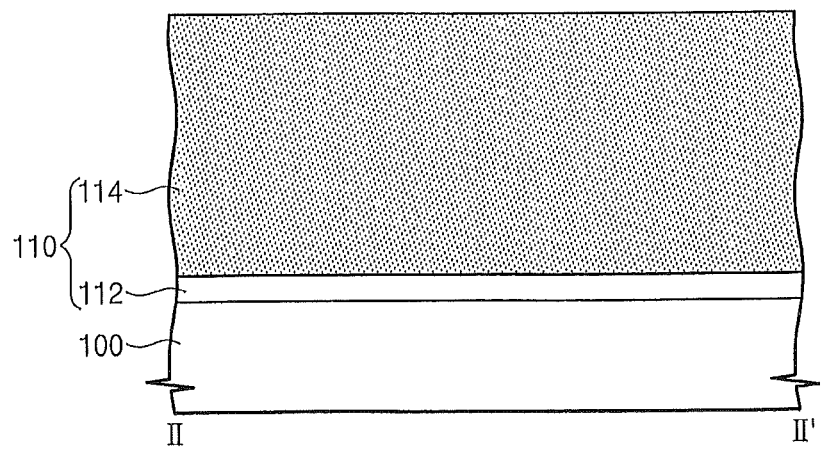

Referring to FIGS. 3A and 3B, a liner 112 and a filling layer 114 may be formed to substantially fill each of the device isolation trenches 105. The liner 112 may be conformally formed on a bottom surface and sidewalls of each of the device isolation trenches 105. The filling layer 114 may be formed on the liner 112 to fill each of the device isolation trenches 105. The filling layer 114 may be formed of a material having an etch selectivity with respect to the spacers 195 of FIG. 1A that are formed in a subsequent process. The liner 112 and the filling layer 114 may be formed, for example, by depositing a liner layer and a filling layer on the substrate 100 and then planarizing the deposited filling layer and the deposited liner layer. Thus, a plurality of device isolation patterns 110 may be formed that are spaced apart from each other in the first direction. The first direction may correspond to the x-axis direction in FIG. 1A. Each of the device isolation patterns 110 may include the liner 112 and the filling layer 114 that fills each of the device isolation trenches 105.

The liner 112 may include an oxide. The filling layer 114 may include silicon oxide (e.g., TOSZ oxide). In other embodiments, the liner 112 may be omitted. After the device isolation patterns 110 are formed, the first mask layer 155 may be removed.

Figure 4A:
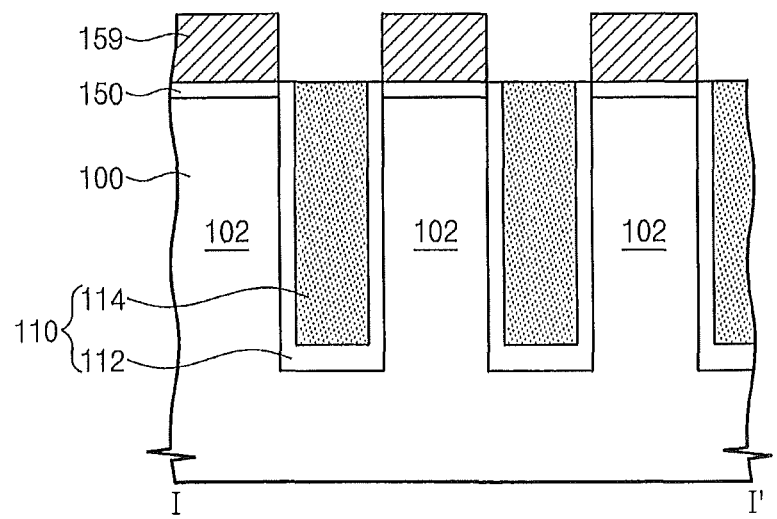
Figure 4B:
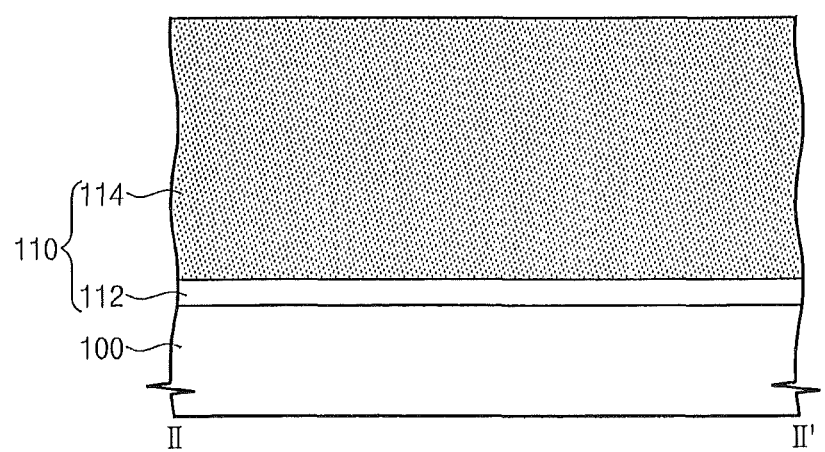

Referring to FIGS. 4A and 4B, the buffer dielectric layer 154 may be removed to expose top surfaces of the active portions 102. A tunnel dielectric layer 150 may be formed on the exposed top surface of each of the active portions 102. The tunnel dielectric layer 150 may be formed by an oxidation process or an oxidation/nitridation process. For example, the tunnel dielectric layer 150 may be formed of an oxide (e.g., silicon oxide) and/or an oxynitride (e.g., silicon oxynitride). Preliminary charge storage patterns 159 may be formed on the tunnel dielectric layer 150 that is disposed on each of the active portions 102. The preliminary charge storage patterns 159 may be formed by forming a preliminary charge storage layer on an entire surface of the substrate 100 and then patterning the preliminary charge storage layer. The preliminary charge storage patterns 159 that are respectively disposed over the active portions 102 may be spaced apart from each other and extend in a second direction that is perpendicular to the first direction. The second direction may correspond to the y-axis direction of FIG. 1A. The preliminary charge storage patterns 159 may include a semiconductor material (e.g., poly-silicon).

Figure 5A:
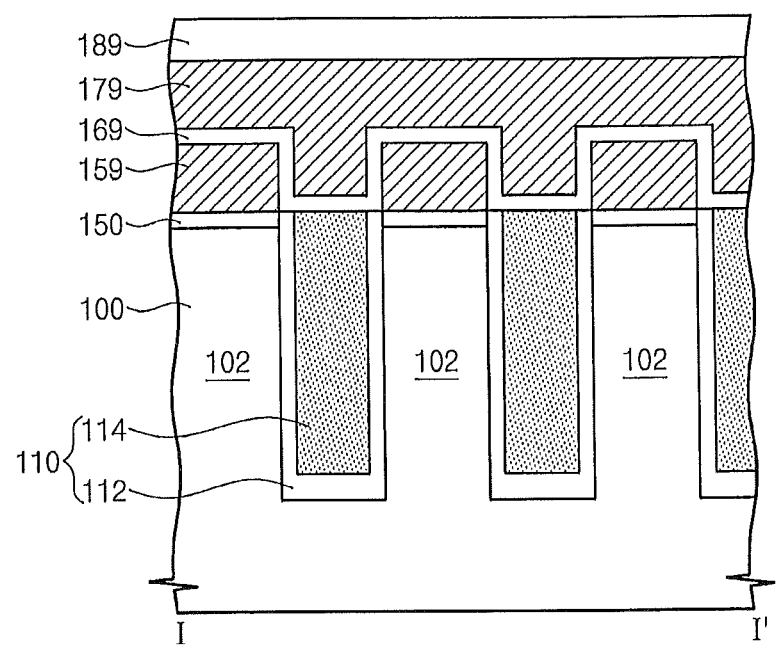
Figure 5B:
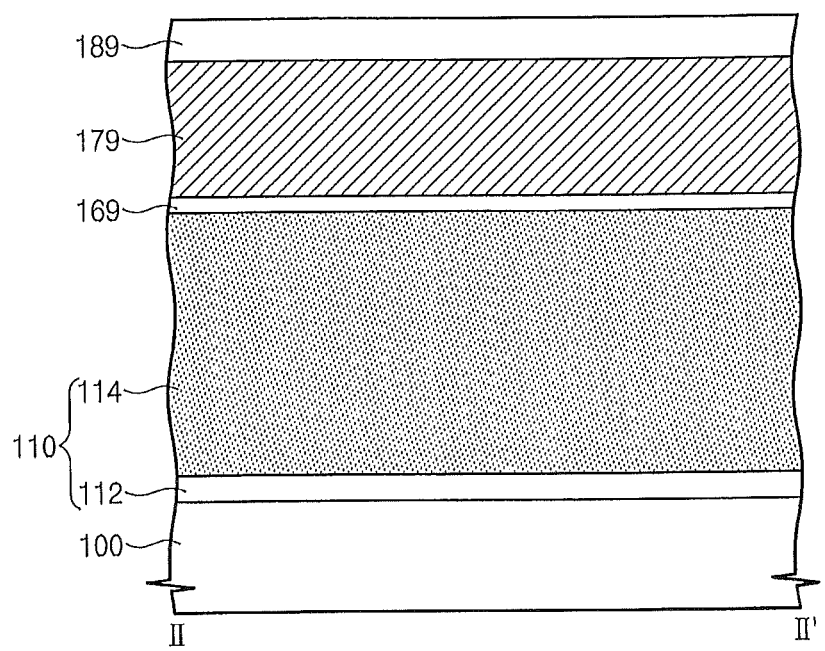

Referring to FIGS. 5A and 5B, a blocking dielectric layer 169 and a control gate conductive layer 179 may be sequentially formed on the substrate 100. The blocking dielectric layer 169 may be formed on the substrate 100 including the preliminary charge storage patterns 159. The blocking dielectric layer 169 may conformally cover the preliminary charge storage patterns 159 and the device isolation patterns 110. For example, the blocking dielectric layer 169 may include an ONO layer.

The control gate conductive layer 179 may be formed on the blocking dielectric layer 169. The control gate conductive layer 179 may include a control base gate conductive layer and a control metal layer that are sequentially stacked. In some embodiments, the control base gate conductive layer may include a doped semiconductor material, and the control metal layer may include a metal having low resistivity such as, for example, tungsten or copper. However, the inventive concepts are not limited thereto. The control gate conductive layer 179 may have various materials and/or various shapes. A capping insulating layer 189 may be formed on the control gate conductive layer 179. The capping insulating layer 189 may include silicon oxide, silicon nitride, and/or silicon oxynitride.

Figure 6A:
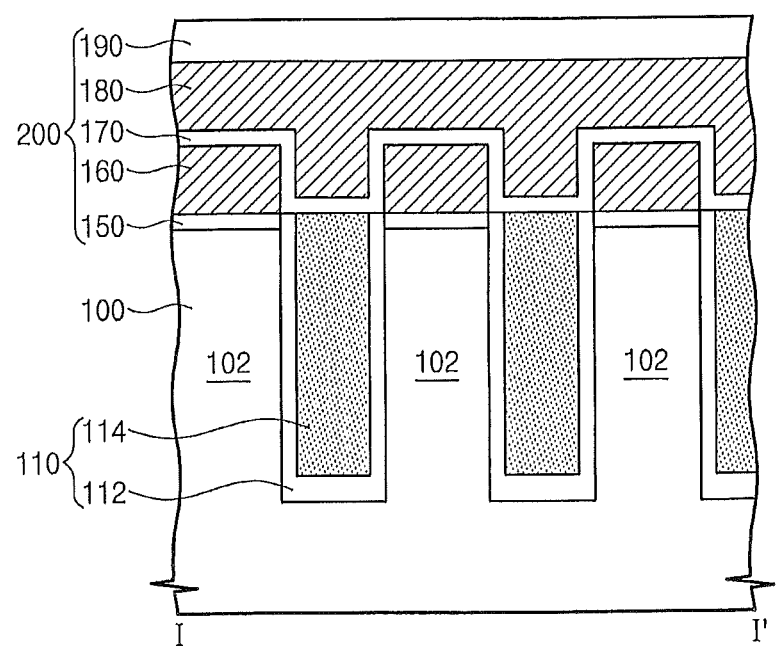
Figure 6B:
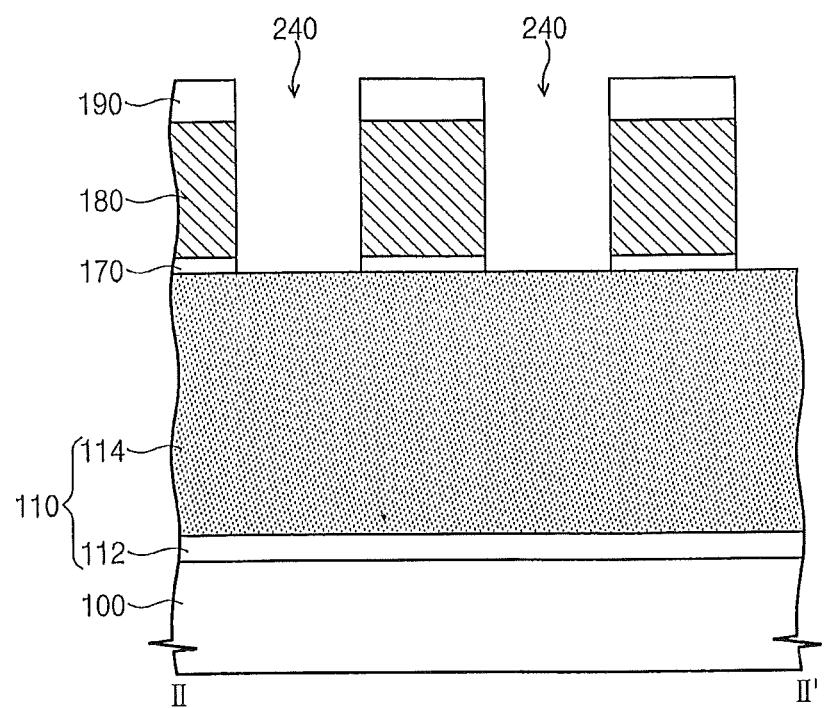

Referring to FIGS. 6A and 6B, second mask patterns (not shown) that extend in the first direction may be formed on the capping insulating layer 189. Subsequently, the capping insulating layer 189, the control gate conductive layer 179, the blocking dielectric layer 169, the preliminary charge storage patterns 159, and the tunnel dielectric layer 150 may be successively etched using the second mask patterns to form cell gate patterns 200. Each of the cell gate patterns 200 may include the tunnel dielectric layer 150, a charge storage pattern 160, a blocking dielectric pattern 170, a control gate electrode 180, and a capping pattern 190 which are sequentially stacked. The cell gate patterns 200 may extend in the first direction and be spaced apart from each other in the second direction. Spacing regions 240 may be defined between the cell gate patterns 200. The cell gate patterns 200 may be word lines of the non-volatile memory device.

Figure 7A:
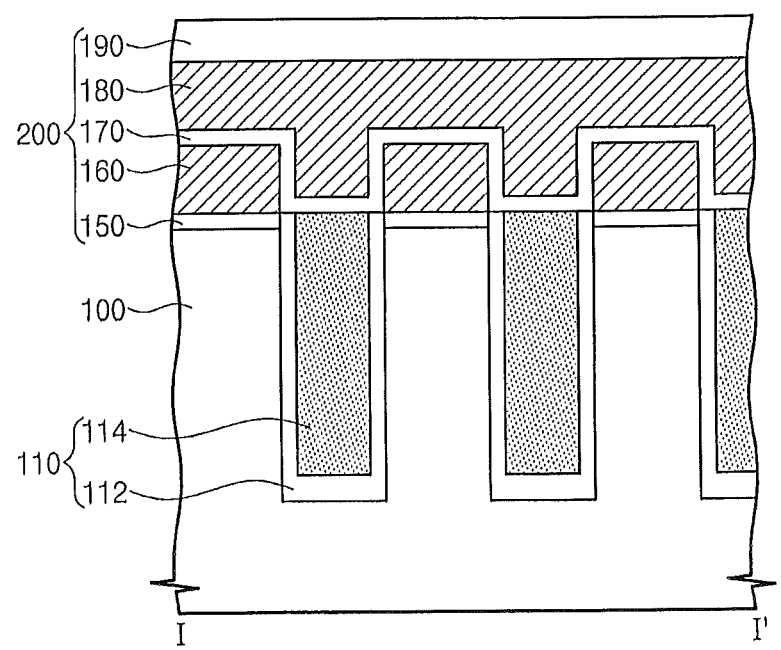
Figure 7B:
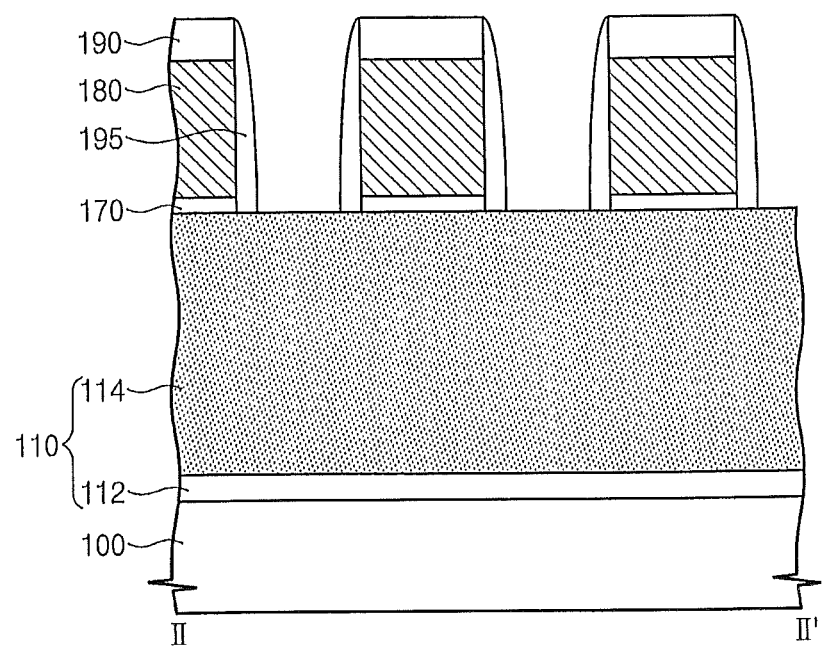

Referring to FIGS. 7A and 7B, spacers 195 may be formed on sidewalls of the cell gate patterns 200, respectively. A spacer layer (not shown) may be conformally formed on the substrate 100 having the cell gate patterns 200. The spacer layer may then be anisotropically etched to form the spacers 195. The spacers 195 may be formed of a material having an etch selectivity with respect to the filling layer 114 of the device isolation pattern 110. For example, the spacers 195 may include silicon oxide (e.g., HDP oxide). The spacers 195 may reduce or prevent damage to the cell gate patterns 200 during a subsequent etching process.

Figure 8A:
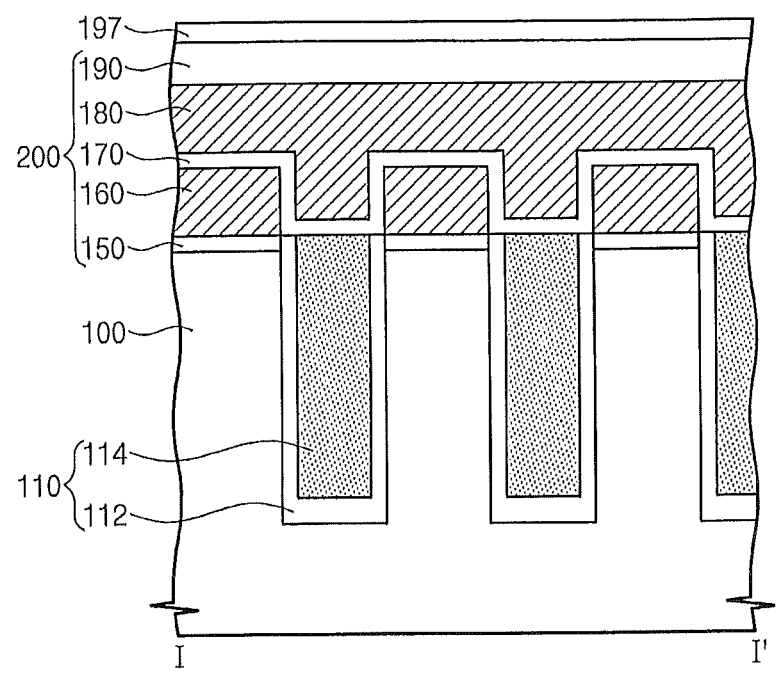
Figure 8B:
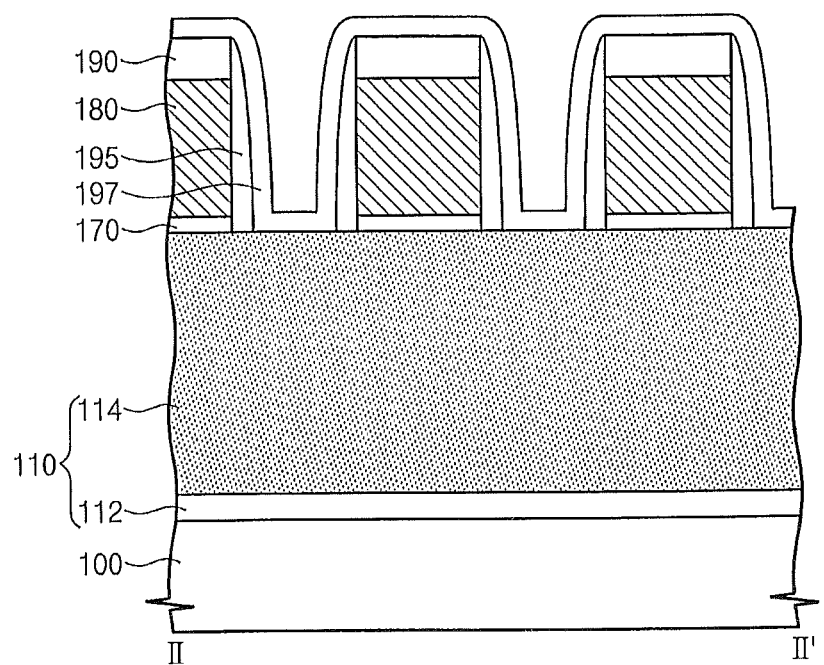

Referring to FIGS. 8A and 8B, a gate protecting layer 197 may be formed on the cell gate patterns 200 and the spacers 195. The gate protecting layer 197 may be conformally formed on the cell gate patterns 200 and the spacers 195. The gate protecting layer 197 may also help protect the cell gate patterns 200 from damage during the subsequent etching process. The gate protecting layer 197 may be formed of a material having an etch selectivity with respect to the filling layer 114 of the device isolation pattern 110. In some embodiments, a difference between an etch rate of the filling layer 114 and an etch rate of the gate protecting layer 197 may be greater than a difference between the etch rate of the filling layer 114 and an etch rate of the spacers 195. For example, the gate protecting layer 197 may include silicon nitride.

In other embodiments, the spacers 195 may be omitted, and the gate protecting layer 197 may be formed directly on the sidewalls of the cell gate patterns 200. In other words, the spacers 195 of silicon oxide and/or the gate protecting layer 197 of silicon nitride may be formed on the sidewalls of the cell gate patterns 200. One or all of the spacers 195 and the gate protecting layer 197 may be formed on the sidewalls of the cell gate patterns 200.

Figure 9A:
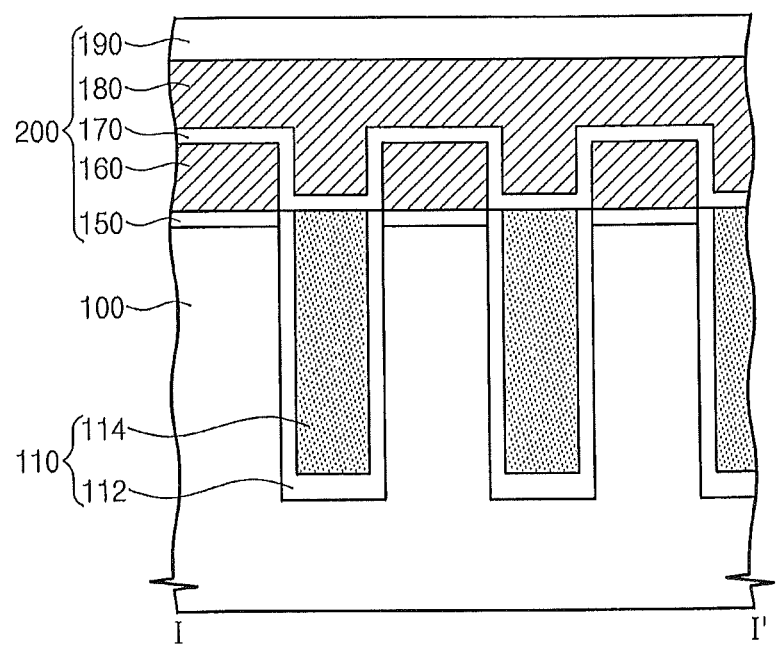
Figure 9B:
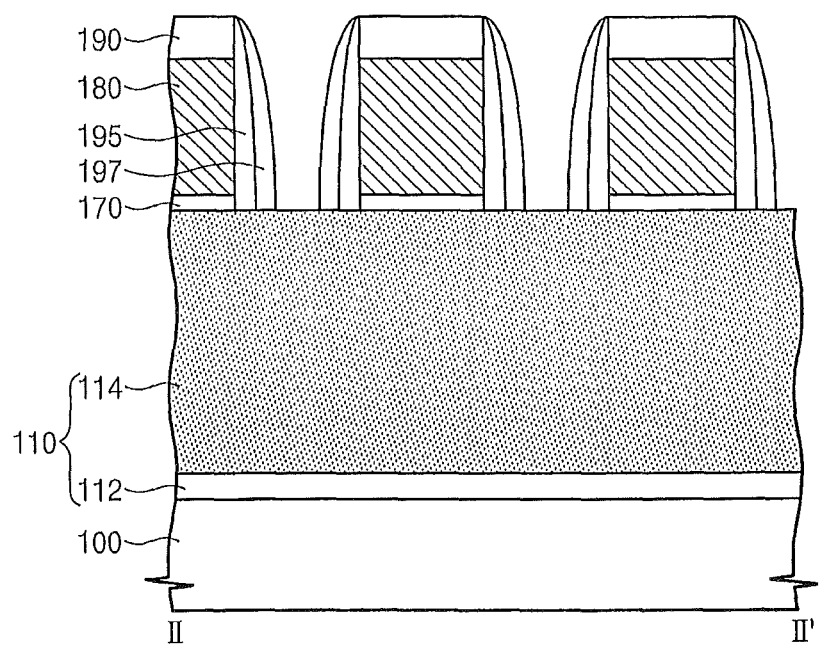

Referring to FIGS. 9A and 9B, an etching process may be performed that exposes the substrate 100 and the device isolation patterns 110. The gate protecting layer 197 may be anisotropically etched by this etching process to expose the active portions 102 and the device isolation patterns 110. Thus, the active portions 102 and the device isolation patterns 110 may be exposed between the cell gate patterns 200 extending in the first direction and spaced apart from each other.

In other embodiments, the gate protecting layer 197 described with reference to FIGS. 8A, 8B, 9A, and 9B may be omitted. In this case, after the spacers 195 of FIGS. 7A and 7B are formed, a process of FIGS. 10A and 10B may be performed.

Figure 10A:
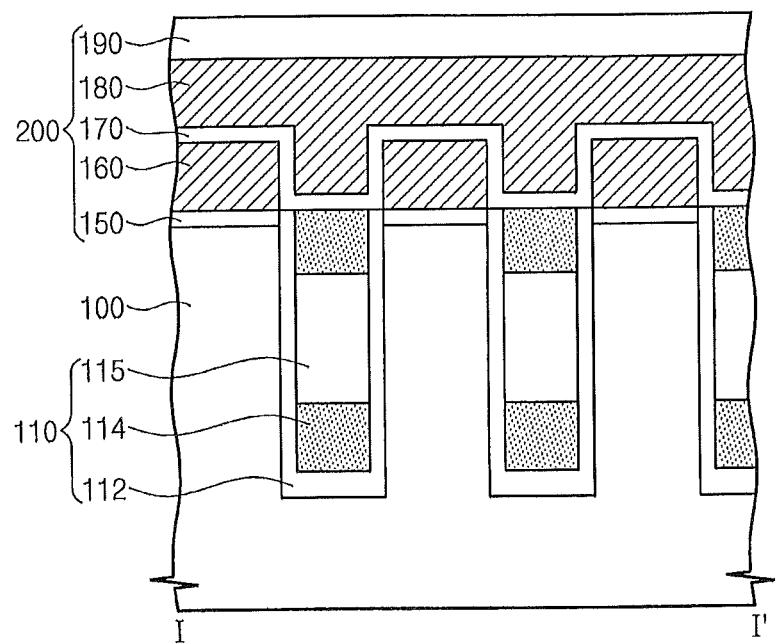
Figure 10B:
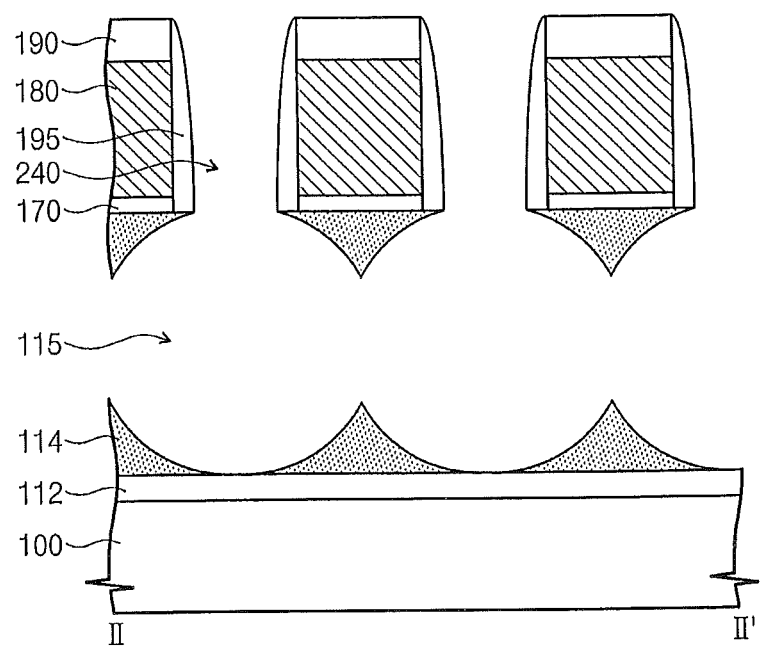

Referring to FIGS. 10A and 10B, first air gaps 115 are formed in the device isolation patterns 110. At least a portion of the filling layer 115 of each device isolation pattern 110 may be removed to form the first air gap 115. Forming the first air gaps 115 may include isotropically etching the device isolation patterns 110 that are exposed between the cell gate patterns 200. Thus, the portions of the filling layer 114 that are exposed by each of the spacing regions 240 between the cell gate patterns 200 may be isotropically etched. The isotropically etched regions respectively formed under spacing regions 240 and in each of the device isolation patterns 110 may be connected with each other to form the first air gap 115. Due to the isotropic etching process, each of top and bottom surfaces of the first air gap 115 may have a wave-shape in a cross-sectional view taken along a longitudinal direction of the device isolation pattern 110 and portions of the filling layer 114 may remain along a profile of the first air gap 115 in the device isolation pattern 110.

For example, the isotropic etching process performed on the device isolation patterns 110 may include a wet etching process using hydrofluoric acid (HF). When the first air gaps 115 are formed, the spacers 195 may have the etch selectivity with respect to the filling layer 114. Thus, the spacers 195 may remain to protect the cell gate patterns 200 from the isotropic etching process that is used to form the air gaps 115. Additionally, if the gate protecting layer 197 described with reference to FIGS. 8A, 8B, 9A, and 9B is formed, the gate protecting layer 197 may have etch selectivity with respect to the filling layer 114 when the first air gaps 115 are formed. In some embodiments, the etch rate of the gate protecting layer 197 may be lower than the etch rate of the spacers 195 in the isotropic etching process for the formation of the air gaps 115. Thus, the gate protecting layer 197 may more effectively protect the cell gate patterns 200. After the air gaps 115 are formed, the gate protecting layer 197 may be removed.

Referring to FIG. 1A again, the first air gap 115 may generally not be formed in portions of the device isolation patterns 110 that are under the selection gate pattern 210 (although some etching may occur underneath edge regions of the selection gate pattern 210, as shown). In other words, since the width W2 of the selection gate pattern 210 may be greater than the width W1 of the cell gate pattern 200, the filling layer 114 under at least a central portion of the selection gate pattern 210 may remain during the isotropic etching process for the formation of the air gaps 115. Thus, the first air gaps 115 may extend in the second direction under the cell gate patterns 210, and side ends of the first air gaps 115 that are adjacent to the selection gate pattern 210 may be closed by the filling layer 114 that remains under the central portion of the selection gate pattern 210.

Figure 11A:
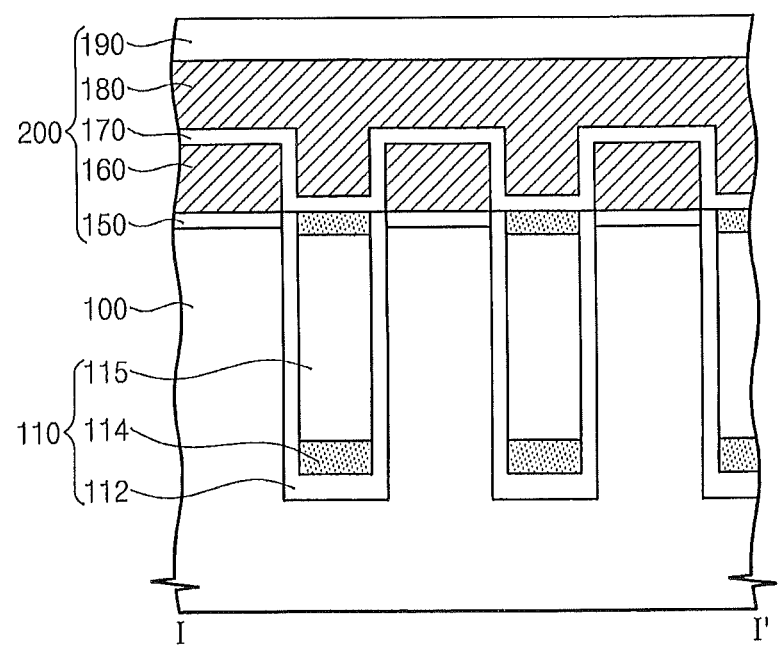
Figure 11B:
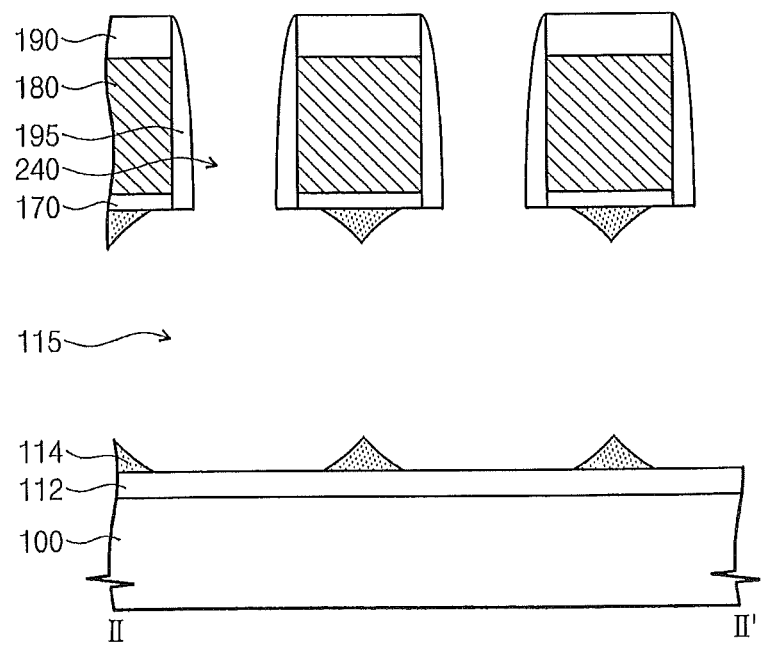

Referring to FIGS. 11A and 11B, in some embodiments, the filling layers 114 may be etched even further (by extending the time of the etching process or by a subsequent etching process) to enlarge the first air gaps 115. In more detail, the filling layers 114 that are exposed between the cell gate patterns 200 may be sufficiently isotropically etched to reduce the remaining portion of the filling layers 114, so that the first air gaps 115 may be enlarged. As illustrated in FIG. 11B, the filling layers 114 may be isotropically etched until the blocking dielectric patterns 170 are exposed. The blocking dielectric patterns 170 may have an etch selectivity with respect to the filling layers 114, so that the blocking dielectric patterns 170 may function as etch stop layers in the isotropic etching process for the formation of the first air gaps 115. The filling layers 114 may also or alternatively be isotropically etched until the liners 112 are exposed. In this case, the liners 112 may have an etch selectivity with respect to the filling layers 114, such that the liners 112 may function as etch stop layers in the isotropic etching process for the formation of the first air gaps 115. Hereinafter, the first air gaps 115 illustrated in FIGS. 10A and 10B will be described as an example.

Figure 12A:
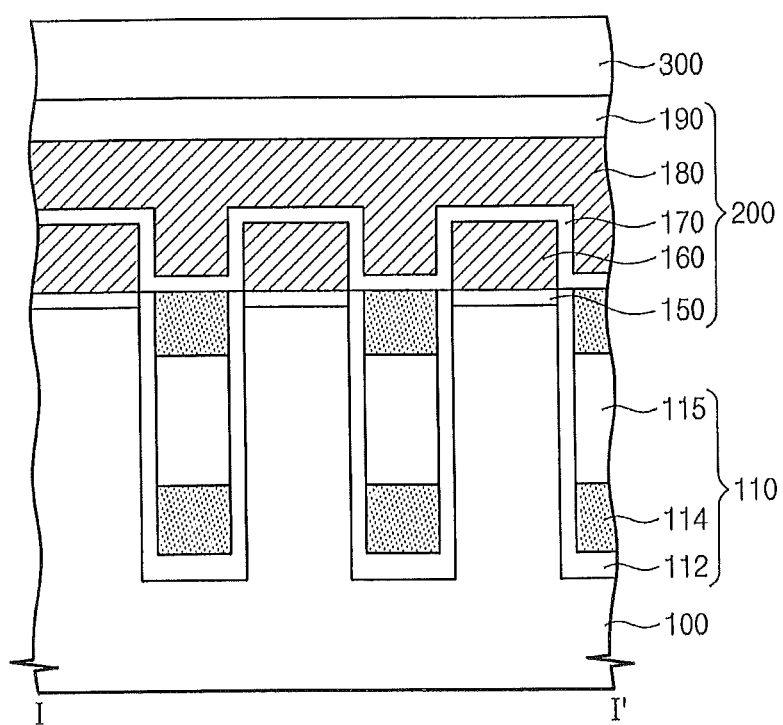
Figure 12B:
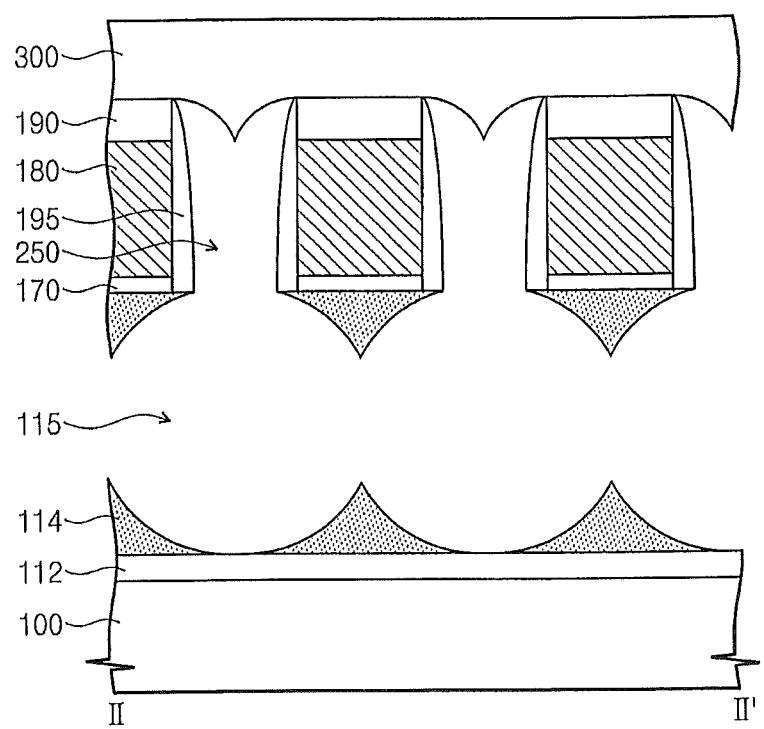

Referring to FIGS. 12A and 12B, an interlayer dielectric layer 300 may be formed on the cell gate patterns 200. The interlayer dielectric layer 300 may be formed on the entire surface of the substrate 100. The interlayer dielectric layer 300 may be formed of an insulating material that has a low step coverage property. The interlayer dielectric layer defines top surfaces of second air gaps 250 that are provided between the cell gate patterns 200. The interlayer dielectric layer 300 may not completely fill the spacing regions between the cell gate patterns 200, so that the second air gaps may be formed. In other words, the second air gaps 250 may be surrounded by the cell gate patterns 200 and the interlayer dielectric layer 300. Each of the second air gaps 250 may extend in the first direction between two of the cell gate patterns 200 or between a cell gate pattern 200 and the selection gate pattern 210. The second air gaps 250 may be spaced apart from each other in the second direction. The interlayer dielectric layer 300 may include silicon oxide (e.g., TEOS oxide). One of the second air gaps 250 may be formed between the selection gate pattern 210 of FIG. 1A and the cell gate pattern 200 nearest thereto. Although not shown in the drawings, interconnections such as a common source line and bit lines may be formed to realize the non-volatile memory device.

The non-volatile memory device according to the present embodiment includes the device isolation patterns 110 having the first air gaps 115. The air gaps 115 are each disposed between a pair of adjacent active portions 102 so that channel coupling therebetween may be reduced to improve the programming characteristic of the non-volatile memory device. Each of the top surface and the bottom surface of the first air gap 115 may have the wave-shape in a cross-sectional view taken long the longitudinal direction of the device isolation pattern 200. Due to the profile of the first air gaps 115, the filling layer 114 may remain along the top and bottom surfaces of the first air gaps 115. Additionally, the second air gaps 250 may be disposed between the cell gate patterns 200 and between the selection gate pattern 210 and the cell gate pattern 200 nearest thereto, such that the parasitic capacitances between adjacent gate patterns 200 and 210 may be reduced to improve the programming characteristic of the non-volatile memory device.

The non-volatile memory devices described above include a plurality of device isolation patterns that are spaced apart from each other in the first (x) direction and which extend in a second (y) direction. A plurality of spaced apart gate structures including cell gate structures and a selection gate structure each cross over the device isolation patterns. Each of the device isolation patterns includes a first air gap that extends continuously under the cell gate structures (i.e., the first air gap is one continuous air gap as opposed to a plurality of discrete air gaps).

Moreover, a height of each first air gap in a third direction (the z-direction in FIG. 1A) may vary because of the wave shape of the portions of the filling layer that define the top and bottom surfaces of the first air gap in the cross-sectional view of FIG. 1D. In particular, the height of each first air gap is reduced under the cell gate structures, reaching a minimum at approximately the mid-point of the width W1 of each cell gate structure. In contrast, the height of each first air gap is increased in the regions between adjacent cell gate structures, and reaches a maximum value at approximately the mid-point between adjacent cell gate structures.

The non-volatile memory devices described above may be encapsulated using various packaging techniques. For example, the non-volatile memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the non-volatile memory device according to one of the above embodiments is mounted may further include at least one semiconductor device (e.g., a controller and/or a logic device) that controls the non-volatile memory device.

Figure 13:
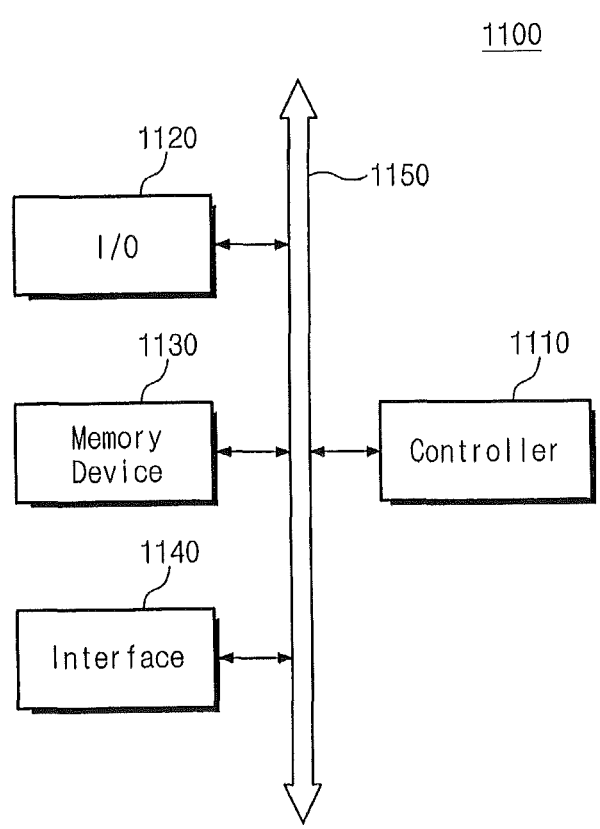
FIG. 13 is a schematic block diagram illustrating an example electronic system that includes a non-volatile memory device according to embodiments of the inventive concepts.

FIG. 13 is a schematic block diagram illustrating an example of an electronic system that includes a non-volatile memory device according to embodiments of the inventive concepts.

Referring to FIG. 13, an electronic system 1100 according to embodiments of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. If the non-volatile memory devices in the aforementioned embodiments further include logic elements, the controller 1110 may include at least one of the non-volatile memory devices according to the embodiments described above. The I/O unit 1120 may include a keypad, a keyboard and/or a display unit. The memory device 1130 may store data and/or commands. The memory device 1130 may include at least one of the non-volatile memory devices according to the embodiments described above. The memory device 1130 may further include at least one of other types of semiconductor memory devices which are different from the semiconductor devices described above. For example, the memory device 1130 may further include a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 14:
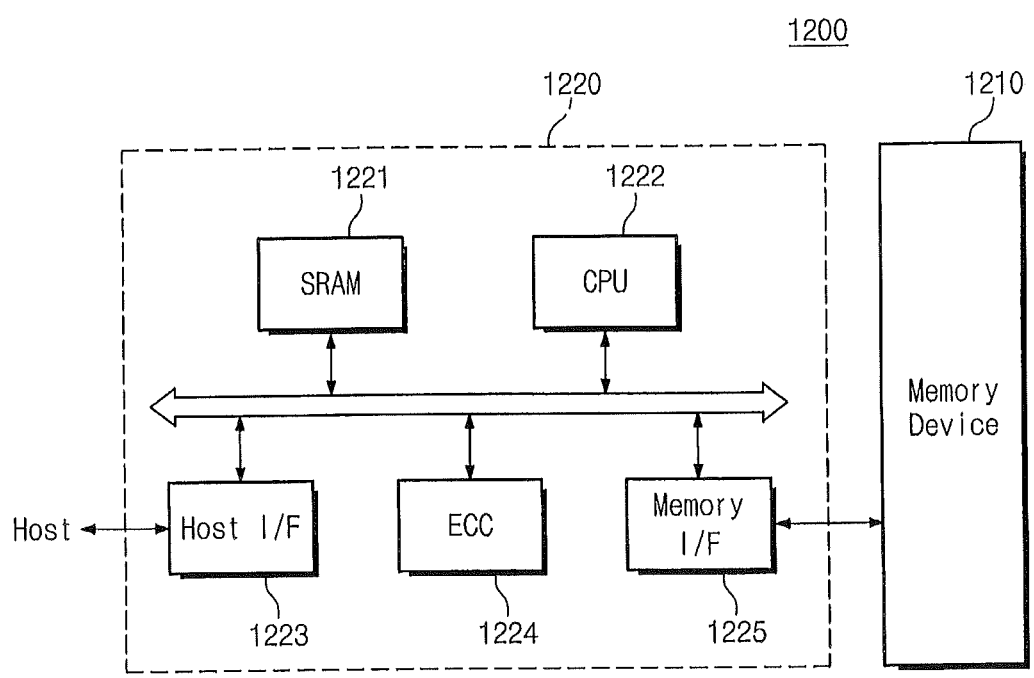
FIG. 14 is a schematic block diagram illustrating an example memory card that includes a non-volatile memory device according to embodiments of the inventive concepts.

FIG. 14 is a schematic block diagram illustrating an example of a memory card that includes a non-volatile memory device according to embodiments of the inventive concepts.

Referring to FIG. 14, a memory card 1200 according to embodiments of the inventive concepts may include a memory device 1210. The memory device 1210 may include at least one of the non-volatile memory devices according to the embodiments mentioned above. In other embodiments, the memory device 1210 may further include at least one of other types of semiconductor memory devices which are different from the semiconductor devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 that is used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Although not shown in the drawings, the memory card 1200 may further include a read only memory (ROM) device that stores code data to interface with the host. The memory card 1200 may be used as a portable data storage card. Alternatively, the memory card 1200 may be realized as a solid state disk (SSD) that is used as a hard disk of a computer system.

As described above, the non-volatile memory devices according to the aforementioned embodiments include device isolation patterns that have first air gaps. The first air gaps are disposed between adjacent active portions so that the channel coupling between the active portions may be reduced to improve the programming characteristic of the non-volatile memory device. The top and bottom surfaces of each of the first air gaps may each have the wave-shape.

Additionally, the second air gap is disposed between adjacent gate patterns so that the parasitic capacitance between the adjacent gate patterns may be reduced to improve the programming characteristic of the non-volatile memory device.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A non-volatile memory device comprising:
    device isolation patterns defining active portions in a substrate, the active portions spaced apart from each other in a wordline direction and extending in a second direction perpendicular to the wordline direction; and
    gate structures on the substrate, the gate structures spaced apart from each other in the second direction and extending in the wordline direction,
    wherein each of the device isolation patterns includes a respective surface that defines a bottom portion of a respective first gap for each of the device isolation patterns; and
    wherein each of the surfaces has a wave-shape in a cross-sectional view taken along the second direction.

2. The non-volatile memory device of claim 1, wherein each of the device isolation patterns includes a filling layer having one or more lower portions; and
    wherein each respective first gap is between the one or more lower portions of the filling layer of the device isolation pattern and the gate structures.

3. The non-volatile memory device of claim 2, wherein the filling layer defines the wave-shape.

4. The non-volatile memory device of claim 2, further comprising:
    spacers disposed on sidewalls of the gate structures, respectively,
    wherein the spacers include a material having an etch selectivity with respect to the filling layer.

5. The non-volatile memory device of claim 4, further comprising:
    a gate protecting layer disposed on sidewalls of the gate structures,
    wherein a difference between an etch rate of the filling layer and an etch rate of the gate protecting layer is greater than a difference between the etch rate of the filling layer and an etch rate of the spacer.

6. The non-volatile memory device of claim 1, wherein peaks in the wave-shape of the surfaces are positioned between sidewalls of the gate structures.

7. The non-volatile memory device of claim 1, wherein the respective first gap is included among a plurality of first gaps, the device further comprising:
    an interlayer dielectric layer on the gate structures; and
    a plurality of second gaps above the plurality of first gaps, between adjacent ones of the gate structures, and under the interlayer dielectric layer.

8. The non-volatile memory device of claim 7 wherein second gaps are configured to reduce parasitic capacitance between directly adjacent ones of the gate structures.

9. The non-volatile memory device of claim 8, wherein each of the plurality of first gaps is connected to a respective one of the plurality of second gaps between the gate structures.

10. A non-volatile memory device comprising:
    device isolation patterns defining active portions in a substrate, the active portions spaced apart from each other in a first direction and extending in a second direction perpendicular to the first direction; and
    gate structures on the substrate, the gate structures spaced apart from each other in the second direction and extending in the first direction,
    wherein each of the device isolation patterns includes a respective surface that defines a bottom portion of a respective first gap for each of the device isolation patterns,
    wherein each of the surfaces has a wave-shape in a cross-sectional view taken along the second direction, and wherein peaks in the wave-shape of the surfaces are self-aligned to centers of the gate structures directly across the respective first gap from the peaks.

11. The non-volatile memory device of claim 10, wherein the directly adjacent ones of the peaks are separated by troughs in the wave-shape that are directly across the respective first gap from spaces between the gate structures.

12. The non-volatile memory device of claim 11, wherein the spaces extend in the first direction.

13. A non-volatile memory device comprising:
    device isolation patterns defining active portions in a substrate, the active portions spaced apart from each other in a first direction and extending in a second direction perpendicular to the first direction; and
    gate structures on the substrate, the gate structures spaced apart from each other in the second direction and extending in the first direction,
    wherein each of the device isolation patterns includes a respective surface that defines a bottom portion of a respective first gap for each of the device isolation patterns;
    wherein each of the surfaces has a wave-shape in a cross-sectional view taken along the second direction, wherein the gate structures include cell gate structures and a selection gate structure;
    wherein a width of the selection gate structure is greater than a width of each of the cell gate structures; and
    wherein an end of the respective first gap in the second direction is defined by the respective surface of the device isolation pattern curving upward with the wave-shape toward the selection gate structure to prevent the respective first gap from extending under a full width of the selection gate structure.

14. A non-volatile memory device comprising:
    a plurality of device isolation patterns on a substrate, the device isolation patterns spaced apart from each other in a wordline direction and extending in a second direction that is different from the wordline direction; and
    a plurality of spaced apart gate structures that cross over the device isolation patterns, wherein the device isolation patterns include respective wave-shape surfaces defining respective bottom portions of first air gaps that extend continuously under the plurality of gate structures in the second direction.

15. The non-volatile memory device of claim 14, wherein each of the device isolation patterns includes a filling layer having one or more lower portions; and
    wherein each respective first air gap is between the one or more lower portions of the filling layer and the gate structures.

16. The non-volatile memory device of claim 15, further comprising:
    spacers on sidewalls of the gate structures, respectively,
    wherein the spacers include a material having an etch selectivity with respect to the filling layer.

17. The non-volatile memory device of claim 16, further comprising:
    a gate protecting layer on the spacers, wherein a difference between an etch rate of the filling layer and an etch rate of the gate protecting layer is greater than a difference between the etch rate of the filling layer and an etch rate of the spacers.

18. The non-volatile memory device of claim 14, wherein the first air gaps are configured to reduce coupling between channels in active portions of the substrate.

19. The non-volatile memory device of claim 14, wherein the gate structures include cell gate structures and a selection gate structure;
    wherein a width of the selection gate structure is greater than a width of each of the cell gate structures; and
    wherein an end of the respective first air gap in the second direction is defined by the respective surface of the device isolation pattern curving upward with the wave-shape toward the selection gate structure to prevent the respective first air gap from extending under a full width of the selection gate structure.

20. A non-volatile memory device comprising:
    a plurality of device isolation patterns on a substrate, the device isolation patterns spaced apart from each other in a first direction and extending in a second direction that is different from the first direction; and
    a plurality of spaced apart gate structures that cross over the device isolation patterns, wherein the device isolation patterns include respective wave-shape surfaces defining respective bottom portions of first air gaps that extend continuously under the plurality of gate structures wherein peaks in the wave-shape of the surfaces are self-aligned to centers of the gate structures directly across the respective first air gap from the peaks.

21. The non-volatile memory device of claim 20, wherein directly adjacent ones of the peaks are separated by troughs in the wave-shape that are directly across the respective first air gap from spaces between the gate structures.

* * * * *